US007126516B2

(12) United States Patent
Koc et al.

(10) Patent No.: US 7,126,516 B2
(45) Date of Patent: Oct. 24, 2006

(54) BANDPASS DELTA-SIGMA ANALOG-TO-DIGITAL CONVERTERS

(75) Inventors: Ut-Va Koc, Bridgewater, NJ (US); Jaesik Lee, Bridgewater, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 10/789,681

(22) Filed: Feb. 28, 2004

(65) Prior Publication Data

US 2005/0190091 A1  Sep. 1, 2005

(51) Int. Cl.
*H03M 3/00* (2006.01)
(52) U.S. Cl. .................................... 341/143
(58) Field of Classification Search ............... 341/143
See application file for complete search history.

(56) References Cited

U.S. PATENT DOCUMENTS

| | | | | |
|---|---|---|---|---|
| 4,509,037 | A | 4/1985 | Harris | 340/347 |
| 5,619,536 | A * | 4/1997 | Gourgue | 341/143 |
| 6,459,743 | B1 | 10/2002 | Lipka | 375/329 |
| 6,469,649 | B1 * | 10/2002 | Helkey et al. | 341/143 |
| 6,518,905 | B1 * | 2/2003 | Siferd | 341/143 |
| 6,538,588 | B1 * | 3/2003 | Bazarjani | 341/143 |
| 6,693,573 | B1 | 2/2004 | Linder | 341/143 |
| 6,977,602 | B1 * | 12/2005 | Ostrem et al. | 341/145 |
| 2002/0118128 | A1 * | 8/2002 | Siferd | 341/141 |
| 2004/0164887 | A1 * | 8/2004 | Skones et al. | 341/144 |

FOREIGN PATENT DOCUMENTS

GB  2 278 247  11/1994

OTHER PUBLICATIONS

European Search Report For Application 05250868.6-2206 Dated Apr. 21, 2005.
Anderson, R., "Getting the Most out of Delta-Sigma Converters," published online, Mar. 2003, at: www.analogzone.com/acqt0130.pdf, 7 pages.
Maurino, R., "A 200-MHz IF 11-bit Fourth-Order Bandpass $\Delta\Sigma$ ADC in SiGe," IEEE Journal of Solid-State Circuits, vol. 35, No. 7, pp. 959-967, Jul. 2000.
Cherry, J.A., et al., "Continuous-Time Delta-Sigma Modulators for High-Speed A/D Conversion," Kluwer Academic Publishers (2000) pp. vii-ix and 1-29, no month.
Ritoniemi, T., et al., "Design of Stable High Order 1-Bit Sigma-Delta Modulators," 1990 IEEE Int'l Symposium on Circuits and Systems vol. 4, New Orleans, LA (May 1-3, 1990), pp. 3267-3270.
Baird, R.T., "Stability Analysis of High-Order Delta-Sigma Modulation for ADC's," IEEE Transactions on Circuits and Systems—II: Analog and Digital Signal Processing, vol. 41, No. 1, pp. 59-62, Jan. 1994.

(Continued)

*Primary Examiner*—Howard L. Williams
(74) *Attorney, Agent, or Firm*—John F. McCabe (57) ABSTRACT

An apparatus includes a delta-sigma analog-to-digital converter for digitalizing an analog input signal. The $\Delta$-$\Sigma$ ADC includes an analog band-pass loop filter configured to filter an analog signal derived from the analog input signal and a quantizer configured to produce a series of digital signals by sampling the filtered analog signal from the loop filter at a sampling frequency. The loop filter has a center band-pass frequency. The series of digital signals has a data-carrying frequency spectrum that is a mirror image of a data-carrying frequency spectrum of the analog input signal. The data-carrying frequency spectrum of the series is located between the center band-pass frequency and zero.

15 Claims, 5 Drawing Sheets

OTHER PUBLICATIONS

Candy, J.C., "A Use of Double Integration in Sigma Delta Modulation," IEEE Transactions on Communications, vol. Com-33, No. 3, pp. 249-258, Mar. 1985.

Noriega, G, "Sigma-Delta A/D Converters—Audio and Medium Bandwidths," RMS Instruments Data Recording Systems Technical Notes—DT3, pp. 1-7, Feb. 1996.

A/D and D/A Conversion/Sampling Circuits Temperature Sensors, Maxim Appl. Note 1870, "Demystifying Sigma-Delta ADCs," publ'd online, 2003, at: www.maxim-ic.com/an1870, pp. 1-15, no month.

Stikvoort, E.F., "Some Remarks on the Stability and Performance of the Noise Shaper or Sigma-Delta Modulator," IEEE Transactions on Communications, vol. 36, No. 10, pp. 1157-1162, Oct. 1988.

Hussein, A.I., "Bandpass $\Sigma\Delta$ Modulator Employing Undersampling of RF Signals for Wireless Communication," IEEE Transactions on Circuits and Systems-II: Analog and Digital Signal Processing, vol. 47, No. 7, pp. 614-620, Jul. 2000.

Shoaei, O., et al., "Design and Implementation of a Tunable 40 MHz-70 MHz Gm-C Bandpass $\Delta\Sigma$ Modulator," IEEE Transactions on Circuits and Systems—II: Analog and Digital Signal Processing, vol. 44., No. 7, pp. 521-530, Jul. 1997.

Salo, T., et al., "A 80-MHz Bandpass $\Delta\Sigma$ Modulator for a 100-MHz IF Receiver," IEEE Journal of Solid-State Circuits, vol. 37, No. 7, pp. 798-808, Jul. 2002.

Yang, C.C., et al., "Transfer Function Design of Stable High-Order Sigma-Delta Modulators with Root Locus Inside Unit Circle" (2002), publ'd online at: AP-ASIC Pacific, Conf. Proceedings 2002, 4 pages, no month.

Leuciuc, A., "Nonlinear stabilization techniques for DS modulators: A comparison", Proceedings of 1999 European Conference on Circuit Theory and design ECCTD'99, Stresa, Italy, Aug. 29-Sep. 2, 1999, vol. 2, pp. 679-682.

Okamoto, T., "A Stable High-Order Delta-Sigma Modulator with an FIR Spectrum Distributor," IEEE Journal of Solid-State Circuits, vol. 28, No. 7, pp. 730-735, Jul. 1993.

\* cited by examiner

BANDPASS DELTA-SIGMA ANALOG-TO-DIGITAL CONVERTERS

BACKGROUND

1. Field of the Invention

This invention relates generally to analog-to-digital converters and, more specifically, to apparatus and methods using delta-sigma analog-to-digital converters.

2. Description of the Related Art

Recently, the telecommunications community has considered data receivers in which analog-to-digital (AD) conversion happens very close to the receiving antenna. Performing AD conversion close to the receiving antenna significantly reduces the amount of signal processing, e.g., filtering and demodulation, performed in the analog domain. Instead, when AD conversion occurs near the receiving antenna, signal processing is performed on the digital signals produced by AD conversion. The displacement of signal processing to the digital domain is desirable, because digital devices typically have lower temperature sensitivities, more linear behavior, and higher component tolerances than their analog counterparts.

Figure 1:
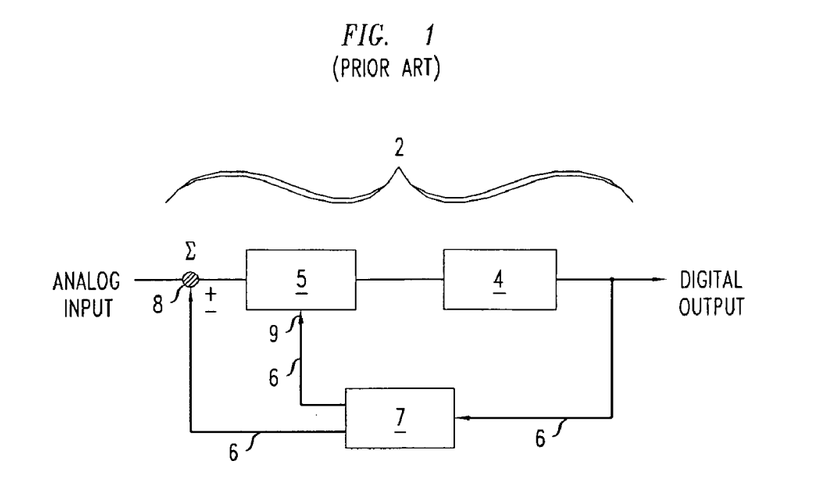
FIG. 1 is a block diagram for a conventional delta-sigma analog-to-digital converter ($\Delta$-$\Sigma$ ADC)

One type of AD converter is known as a delta-sigma AD converter ($\Delta$-$\Sigma$ ADC). Referring to FIG. 1, an exemplary $\Delta$-$\Sigma$ ADC 2 includes a clocked quantizer 4, a loop filter 5, and a feedback loop 6 with a digital-analog (DA) converter 7. The quantizer 4 performs a sampling operation that produces the analog-to-digital conversion. The feedback loop 6 produces analog signals with values responsive to the values of the digital output signals from the quantizer 4 and feeds the analog signals back. The fed back analog signals are sequentially combined with an analog input signal to form the analog signal that the loop filter 5 will process. For example, an adder 8 may add the fed back analog signals to analog input signals, and/or one or more intermediate taps 9 into the loop filter 5 may combine the fed back analog signals with analog signals generated in the loop filter 5.

By feeding back signals responsive to the digital output signals, $\Delta$-$\Sigma$ ADCs reduce the contribution of quantization noise to selected frequency components of the digital output signal. For the selected frequency components, signal-to-noise ratios (SNR) are typically higher in $\Delta$-$\Sigma$ ADCs having higher oversampling ratios (OSRs) than in $\Delta$-$\Sigma$ ADCs having lower OSRs. Herein, the OSR is defined as the ratio of an AD converter's sampling frequency to the data bandwidth of the analog input signal being digitalized by the AD converter. In the selected frequency band, the value of the SNR is also typically higher in $\Delta$-$\Sigma$ ADCs with high-order loop filters than in $\Delta$-$\Sigma$ ADCs with low-order loop filters. Unfortunately, high-order loop filters also can cause unacceptable instabilities into the operation of a $\Delta$-$\Sigma$ ADC.

Some conventional $\Delta$-$\Sigma$ ADCs use fourth-order loop filters and quantizers with high sampling frequencies, e.g., sampling frequencies that are four times the center carrier frequency of the analog input signal.

SUMMARY

High sampling frequencies are undesirable when carrier waves have high center carrier frequencies. In particular, integrated circuit structures for implementing high sampling frequencies are either complex or unavailable at high center carrier frequencies.

Various embodiments of $\Delta$-$\Sigma$ ADCs may not need high sampling rates for efficient operation. The new $\Delta$-$\Sigma$ ADCs sample an analog input signal at a frequency close to the signal's central carrier frequency. Even though such a sampling frequency does not produce a very high OSR, the new $\Delta$-$\Sigma$ ADCs may still generate high output SNRs and have stable operation. Due to the lower sampling frequencies, the new $\Delta$-$\Sigma$ ADCs may be simple, dissipate less power, and have low jitter requirements.

In one aspect, the invention features an apparatus that includes a delta-sigma analog-to-digital converter for converting an analog input signal. The $\Delta$-$\Sigma$ ADC includes an analog band-pass loop filter configured to filter an analog signal derived from the analog input signal and a quantizer configured to produce a series of digital signals by sampling the filtered analog signal from the loop filter at a sampling frequency. The loop filter has a center band-pass frequency. The series of digital signals has a data-carrying frequency spectrum that is a mirror image of a data-carrying frequency spectrum of the analog input signal. The data-carrying frequency spectrum of the series of digital signals is located between the center band-pass frequency and zero.

In another aspect, the invention features a method for operating a $\Delta$-$\Sigma$ ADC. The method includes transmitting an analog input signal having a data-carrying band to the $\Delta$-$\Sigma$ ADC to convert the analog input signal into a series of digital signals having a data-carrying band. The series of digital signals has a data-carrying frequency spectrum that is a mirror image of a data-carrying frequency spectrum of the analog input signal. The data-carrying frequency spectrum of the series is located between the center band-pass frequency and zero.

BRIEF DESCRIPTION OF THE DRAWINGS

Herein, like reference numbers indicate features with similar functions.

DETAILED DESCRIPTION OF ILLUSTRATIVE EMBODIMENTS

Below, various embodiments are described with reference to accompanying figures and description. Nevertheless, the invention may be embodied in other forms and is not limited to the embodiments described below.

Figure 2:
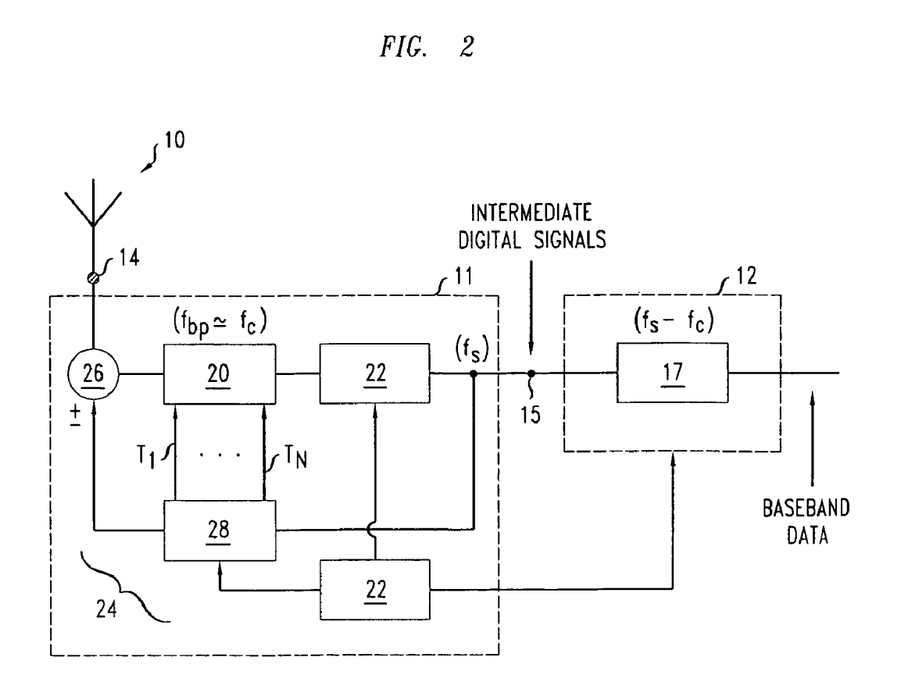
FIG. 2 is a block diagram for one embodiment of a receiver having a $\Delta$-$\Sigma$ ADC.

Referring to FIG. 2, an embodiment of a data receiver includes an antenna 10, an analog circuit 11 and a digital circuit 12. The receiver's antenna 10 converts a captured modulated carrier wave into an analog input signal at input port 14 of the analog circuit 11. The analog circuit 11 performs an analog-to-digital conversion of the analog input signal to produce a series of regularly spaced intermediate digital signals at output port 15. The digital circuit 12 performs primary data processing on the series of intermediate digital signals, i.e., in the digital domain. Exemplary primary data processing usually includes producing a data-carrying, base band signal with low quantization noise. The digital circuit 12 outputs a stream of digital base band data at output port 13.

To produce the base band signal, digital circuit 12 includes a digital demodulator 17 coupled to receive the intermediate digital signals. Herein, a digital demodulator passes a selected frequency band of a received series of digital signals, e.g., a low-noise base-band signal. One example of a digital demodulator is a digital decimator and a low-pass filter coupled to an output of the digital decimator. The digital decimator has a sampling rate that produces a base-band replica of the series of received digital signals, and the low-pass filter selectively passes the base-band replica. Another example of a digital demodulator is digital down mixer that mixes the series of received digital signal with a digital mixing signal whose frequency is appropriate to frequency downshift to a base-band data-carrying signal.

The analog circuitry 11 includes clock drive 18 and a delta-sigma analog-to-digital converter ($\Delta$-$\Sigma$ ADC). The clock drive 18 synchronizes subsystems of the $\Delta$-$\Sigma$ ADC and the digital circuit 12. The $\Delta$-$\Sigma$ ADC converts the analog input signal into the series of intermediate digital signals produced at output port 15. The $\Delta$-$\Sigma$ ADC performs this analog-to-digital (AD) conversion close to the receiver's antenna 10 to facilitate primary data processing in the digital domain.

The $\Delta$-$\Sigma$ ADC produces the intermediate digital signals by filtering and sampling the analog input signal at a constant sampling frequency, $f_s$. The magnitude of $f_s$ is relatively low compared to sampling frequencies of some conventional $\Delta$-$\Sigma$ ADCs. Preferably, for a fourth-order analog band-pass loop filter 20, $f_s$ is equal to $(4/3)f_c \pm 10\%$ where $f_c$ is the center carrier frequency of the modulated carrier wave received at input port 14. More preferably, $f_s=(4/3)f_c \pm 1\%$. Exemplarily, $f_c$ is also equal to $f_{bp}$ where $f_{bp}$ the center band-pass frequency of the analog band-pass filter 20.

The analog $\Delta$-$\Sigma$ ADC includes analog band-pass loop filter 20, quantizer 22, active feedback loop 24, and adder 26. The analog loop filter 20 band pass filters an analog signal prior to its receipt at the quantizer 22. The quantizer 22 generates a series of intermediate digital signals by sampling the analog signal from the loop filter 20 at the sampling frequency, $f_s$. The intermediate digital signals are sent both to output port 15 and to an input of the active feedback loop 24. The active feedback loop 24 converts received intermediate digital signals into corresponding analog signals in one or more feedback streams. The adder 26 sequentially combines the analog signals of one of the feedback streams with an analog input signal received from antenna 10 at input port 14. The adder may combine the analog input and analog feedback signals with a relative phase shift, e.g., a phase shift of 180° so that the adder 26 functions as a subtractor. The analog signals of any other feedback streams are sequentially transmitted to intermediate taps $T_1$–$T_N$ into the loop filter 20.

The loop filter 20 is a band pass resonator having a center band-pass frequency, $f_{bp}$, wherein $f_{bp} \approx f_c$. The loop filter 20 is, at least, of order two and preferably is of order three, four, or higher. Some exemplary loop filters 20 are constructed of cascaded second-order, band-pass resonators that pass signals with the center carrier frequency $f_c$. The loop filter 20 has a band pass whose width is about equal to the width of data-carrying band of the modulated carrier wave received at port 14.

The active feedback loop 24 includes a digital-to-analog (DA) converter 28 that converts individual intermediate digital signals from quantizer 22 into analog signals. The DA converter 28 produces one or more feedback streams of the analog signals. The individual analog signals of each feedback stream correspond the intermediate digital signals from the quantizer 22. Thus, in each feedback stream, the transmission rates of the analog signals are equal to the sampling rate of the quantizer 22. In each feedback stream, individual analog signals have amplitudes equal to the associated feedback stream's gain times the amplitudes of the corresponding intermediate digital signals from the quantizer 22. The DA converter 28 transmits the analog signals of one feedback stream to adder 26 and transmits the analog signals of any additional feedback streams to intermediate taps, $T_1$–$T_N$, into the loop filter 20.

Notably, the series of digital signals at port 15 has the data-carrying frequency spectrum of a mirror image of the analog input signal received at input port 14. Herein, a signal with a mirror-image spectrum is such that its low frequency channels for carrying data correspond to the high frequency channels for carrying data in the original signal, e.g., power spectra are relatively reversed about the centers of the bands associated with an original signal and any of its mirror image. The data-carrying frequency spectrum of the series of digital signals at port 15 is also located between the center band-pass frequency of the loop filter 20 and zero.

Figure 3:
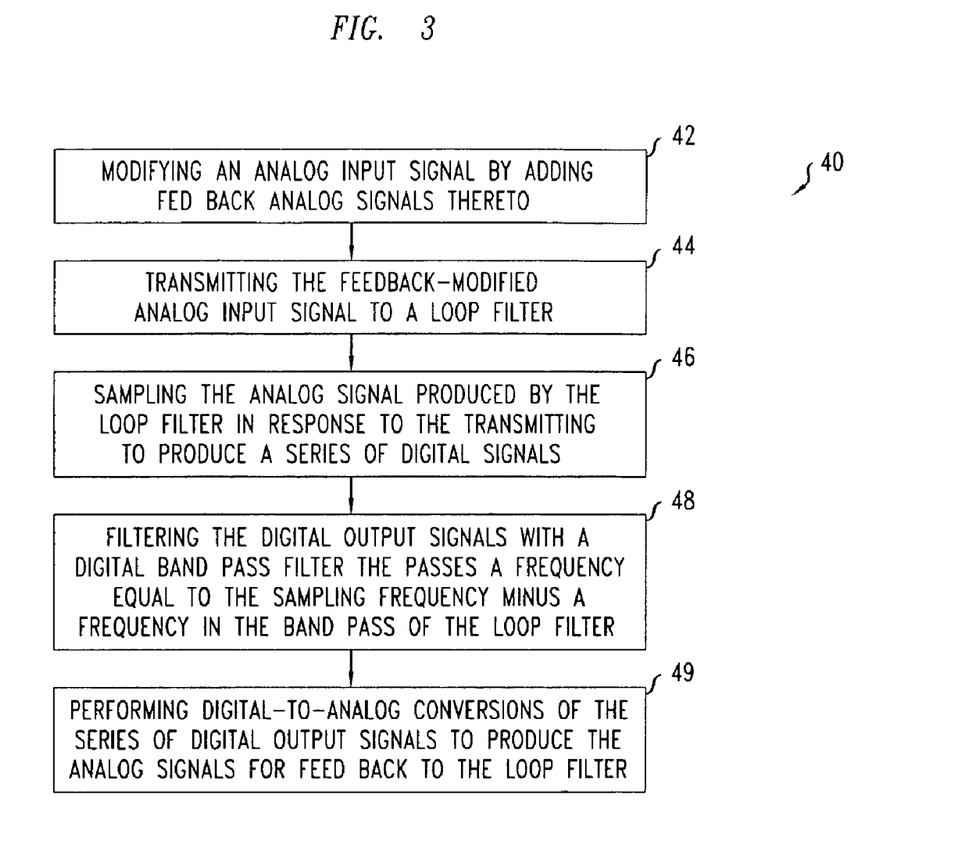
FIG. 3 is a flow chart for a method of operating the $\Delta$-$\Sigma$ ADC of FIG. 2.

FIG. 3 illustrates an exemplary method 40 for operating a $\Delta$-$\Sigma$ ADC, e.g., the $\Delta$-$\Sigma$ ADC of FIG. 2. The method 40 includes producing an analog signal by sequentially adding analog signals from a feedback stream to an analog input signal, e.g., adding the signals in adder 26 of FIG. 2 (step 42). The adding step produces a feedback-modified version of the analog input signal to be DA converted. The method 40 includes transmitting the feedback-modified analog signal to an analog loop filter, e.g., analog band pass loop filter 20 of FIG. 2 (step 44). The analog loop filter is a band pass filter that passes frequencies in the analog loop filter's band pass. The analog loop filter may have a center band-pass frequency, $f_{bp}$, defined by: $f_{bp} \approx f_c$ where $f_c$ is a center carrier frequency of the analog input signal. The analog loop filter's band pass may also be about equal to the data-carrying band for the analog input signal to be DA converted. The method 40 includes sampling a filtered analog signal produced by the analog band-pass loop filter in response to the act of transmitting to produce a series of digital output signals (step 46). The sampling may, e.g., be performed by quantizer 22 of FIG. 2. At the sampling frequency, $f_s$, the sampling step produces additional digital output signals. The series of digital signals has a data-carrying frequency spectrum that is a mirror image of the data-carrying frequency spectrum of the original analog input signal. The data-carrying frequency spectrum of the series is located between the center band-pass frequency of the loop filter and zero.

The method 40 also includes filtering the digital output signals with a digital demodulator, e.g., digital demodulator 17 of FIG. 2 (step 48). The digital demodulator filters the digital output signals to remove frequencies higher than a lower edge of the loop filter's band pass.

Exemplary embodiments of the method 40 also include sequentially performing digital-to-analog conversions of the digital output signal, e.g., in DA converter 28 of FIG. 2, to produce, at the sampling frequency, additional analog signals on one or more parallel feedback streams (step 49). The analog signals of each feedback stream correspond to the digital output signals produced by the sampling. The temporal widths of the analog signals of each feedback stream are shorter than the inverse of the sampling frequency. Exemplary duty cycles of these analog signals are 0.5 or less and preferably, are ⅓ or less or ¼ or less. Herein, the duty cycle of signals in a stream of regularly spaced signals refers to a fraction that is defined by a ratio. The ratio is the time interval during which a signal's amplitude is greater than ½ times the signal's maximum amplitude divided by the full temporal period of one signal. As described below, shortening the duty cycles of fed back analog signals can increase the stability of an Δ-Σ ADC with higher-order analog band-pass loop filters.

Figure 4:
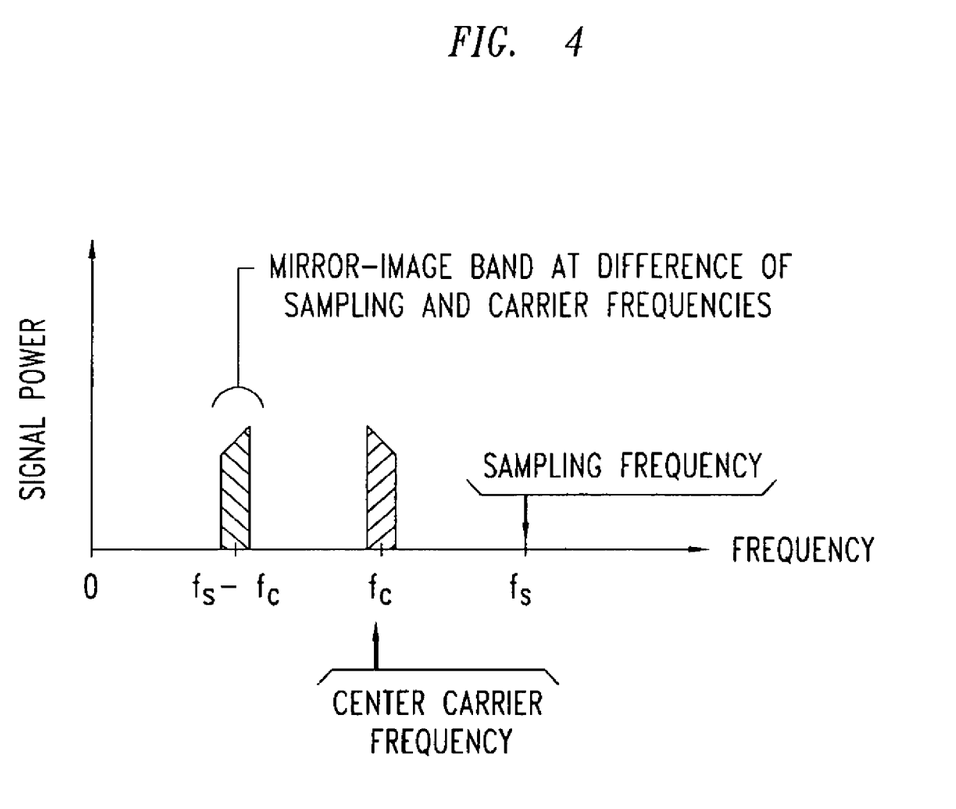
FIG. 4 illustrates the relation between the data-carrying band of an analog input signal input to the $\Delta$-$\Sigma$ ADC of FIG. 2 and a mirror image band of intermediate digital signals output by the $\Delta$-$\Sigma$ ADC.

Referring to FIG. 4, the Δ-Σ ADC of FIGS. 2 and 3 rejects quantization noise for a selected narrow band of the frequency components of the intermediate digital signals. In the selected band, the intermediate digital signals produce a signal power profile that is a mirror image of the signal power profile in the data-carrying band of the modulated carrier received by antenna 10. To distribute analog input signal power in the mirror image band, adder 26 sequentially adds to or subtracts from the analog input signal, i.e., a signal with center carrier frequency $f_c$, analog signals from a feedback stream of the active feedback loop 24, i.e., signals having a frequency, $f_s$. Due to this addition or subtraction, the center frequency, $f_{c\text{-}mi}$, of the mirror image band is equal to the sampling frequency minus the center carrier frequency, i.e., $f_{c\text{-}mi} = f_s - f_c$.

In the receiver of FIG. 2, the mirror image band is the data-carrying band for the intermediate digital signals. The mirror image band can have a relatively low center frequency, because $f_{c\text{-}mi} = f_s - f_c$. For this reason, the data-carrying band of the intermediate digital signals can include low frequencies even when $f_c$ is a high frequency. Such low data-carrying frequencies enable standard integrated-circuit (IC) structures to be used for components of the digital demodulator 17, e.g., a digital down mixer and low pass filter or a decimator and a low-pass filter. In particular, a downshift the data to the base band would only require the low mixing frequency of $f_s - f_c$ as illustrated in FIG. 2. IC technologies are less available for digital signal processing circuits in conventional receivers where high frequencies, e.g., $4f_c$, rather than the low frequencies of a mirror-image band are the data-carrying band of the intermediate digital signals. The lower frequencies of the mirror image band should also reduce power consumption and jitter requirements of the embodiments that use this band to carry the data of the intermediate digital signals.

Referring to FIG. 2, silicon-germanium (SiGe) BiCMOS is a potentially suitable technology for exemplary Δ-Σ ADCs that AD convert analog input signals with a $f_c$ of about 2.0 GHz and a data bandwidth of about 20 mega-Hz (MHz). The exemplary Δ-Σ ADCs could include 4-bit quantizers 22 with fully differential flash-type architectures based on differential resistive ladders and cascades of master-slave comparators. Such 4-bit quantizers 22 could, e.g., have an $f_s$ of about 2.8 GHz so that the mirror image band is in the range of about 1.9–2.1 GHz±20 MHz. The exemplary Δ-Σ ADCs could be fully differential, fourth-order analog band-pass loop filters 20 that are constructed by cascading identical, second-order, band pass resonators. Each second-order resonator could, e.g., have a Gm-OpAmp-C biquad structure and a center band pass frequency of about 2.1 GHz. The Δ-Σ ADCs can include DA converters 28 with pulse shaping logic and calibration loops. The pulse shaping logic would function as a 4-bit, differential, high-speed multiplexer/And-gate synchronized by clock drive 18. Such pulse shaping logic could lower the duty cycle of the intermediate digital pulses from the quantizer 22 thereby reducing sensitivity of the active feedback loop's DA converter 28 to clock jitter. The calibration loop could adjust static nonlinearities of current switches in the DA converters 28, and thus, achieve static resolutions equal to those of the overall Δ-Σ ADC.

The Δ-Σ ADCs of FIG. 2 would be expected to have lower OSR values than conventional Δ-Σ ADCs that sample at higher frequencies. Lower OSR values typically mean less effective suppression of quantization noise. Some of the Δ-Σ ADCs of FIG. 2 partially compensate this undesirable effect of the lower sampling rate by exploiting a multi-bit quantizer 22 and/or a higher-order analog band-pass loop filter 20. Higher-order loop filters better suppress quantization noise than lower-order loop filters. Unfortunately, loop filters having orders that are greater than two can have operating instabilities in Δ-Σ ADCs. The danger of such instabilities has somewhat moderated the use of such higher-order loop filters in Δ-Σ ADCs.

Exemplary embodiments of the Δ-Σ ADC of FIG. 2 have a higher-order band-pass loop filter 20, but do not suffer from operating instabilities. The undesirable operating stabilities are avoided by selecting a special form for the DA converter 28 in active feedback loop 24. In particular, the DA converters 28 could produce return-to-zero (RZ) analog feedback pulses with duty cycles of less than 1.0. Exemplary DA converters 28 produce RZ analog feedback pulses with duty cycles of 0.5 or less, and preferably with duty cycles of ⅓ or less or of ¼ or less. For analog feedback pulses with short duty cycles, a fourth-order band-pass loop filter 20 does not necessarily cause an operating instability.

Figure 5:
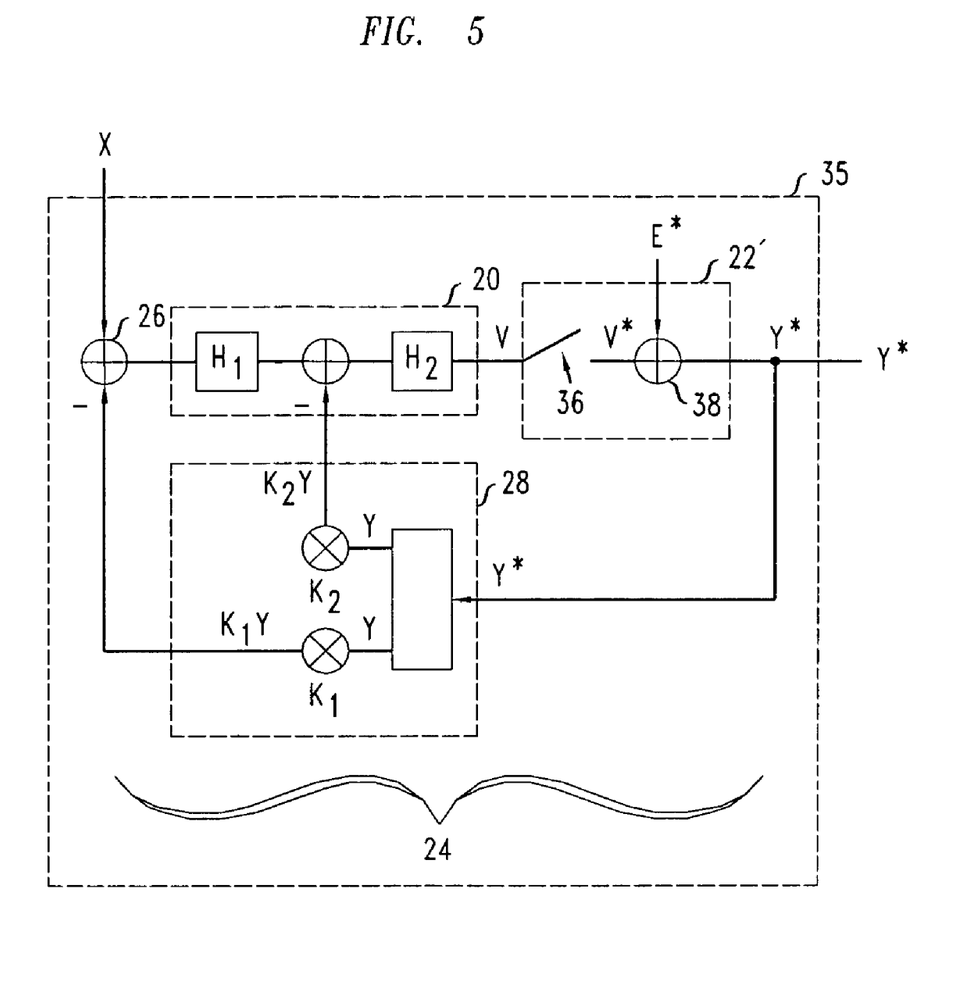
FIG. 5 is a block diagram of a linearized circuit useful for analyzing the stability of exemplary $\Delta$-$\Sigma$ ADCs.

Referring to FIG. 5, a linearized model 35 was used to analyze various Δ-Σ ADCs for operating instabilities. The linearized model 35 replaces the quantizer 20 of the original Δ-Σ ADC with a hardware device 22' that cascades a switch 36 with an adder 38. The switch 36 samples an analog signal V from the analog band-pass loop filter 20 to produce a series of equally spaced digital signals V*. Herein, digital signals are indicated in by an "*", and analog signals do not have "*"s. The adder 38 generates output digital signals, Y*, that correspond, e.g., to the intermediate digital signals of the Δ-Σ ADC of FIG. 2 by adding quantization error, E*, into the digital signals, V*, from the switch 36. The operation of hardware device 22' ensures that the output digital signal, Y*, of the linearized model 35 depends linearly on quantization error, E.

The inventors used linearized model 35 to analyze operating instabilities of Δ-Σ ADCs having fourth-order analog band-pass loop filters 20 formed of a pair of identical, second-order, band pass resonators, $H_1$ and $H_2$. The band pass resonator $H_1$ receives an analog signal given by a difference between the corresponding Δ-Σ ADC's analog input signal, X, and analog signals, $K_1Y$, of a first feedback stream produced by DA converter 28. The second resonator $H_2$ receives an analog signal given by a difference between an output analog signal from the first resonator $H_1$ and analog signals, $K_2Y$, of a second feedback stream produced by the DA converter 28. Here, $K_1$ and $K_2$ are the gains of the first and second feedback streams produced by the DA converter 28.

Each linearized model 35 has an associated Noise Transfer Function (NTF). The poles of the NTF characterize whether the corresponding Δ-Σ ADC has an operating instability. If all poles of the NTF have radii smaller than one, the corresponding Δ-Σ ADC do not have operating instabilities.

Through numerical studies of various forms of linearized model 35, the inventors discovered that the radii for NTF poles are strongly dependent on the form of the analog signals of the one or more feedback streams. The inventors realized that designing Δ-Σ ADCs to produce analog feedback signals having less than full duty cycles enabled the avoidance of the types of operating instabilities associated with higher-order loop filters.

Figure 6A:
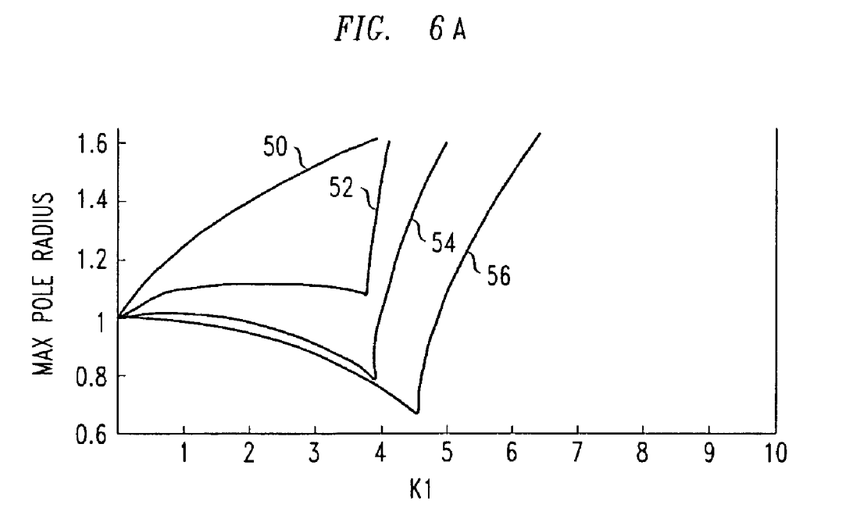
FIGS. 6A–6B show calculated largest radii of noise transfer function poles and output signal-to-noise ratios (SNRs), respectively, for various $\Delta$-$\Sigma$ ADCs.

To illustrate these conclusions, FIG. 6A shows calculated largest radii for NTF poles in linearized models 35 that correspond to several different Δ-Σ ADCs. Each Δ-Σ ADC has a sampling frequency of 2.8 GHz and processes a modulated carrier wave in which data is carried in a band between 1.9 GHz and 2.1 GHz. In each Δ-Σ ADC, the DA converter 28 provided two feedback streams with equal gains, i.e., $K_1=K_2$.

In FIG. 6A, graphs 50, 52, 54, 56 show how maximal radii for NTF poles vary with the gain, $K_1$, of DA converter 28. Graphs 50 and 52 correspond respectively to NRZ type analog feedback signals and to RZ type analog feedback pulses having a duty cycle of 0.5. For both NRZ analog feedback signals and RZ analog feedback pulses with a duty cycle of 0.5, all values of $K_1$ produce an NTF pole whose radius is greater than one. Thus, Δ-Σ ADCs that use these types of analog feedback signals may have operating instabilities. Graphs 54 and 56 correspond to RZ type analog feedback pulses with duty cycles of ⅓ and ¼, respectively. For each of these types of analog feedback pulses, there is always a range of the gain $K_1$ in which all NTF poles have radii smaller than one. $K_1$ values in the approximate range [1.5, 4.1] produce no NTF poles with radii greater than one for RZ analog feedback pulses with duty cycles of ⅓. Similarly, $K_1$ values in the range (0, 4.8] produce no NTF poles with radii greater than one for RZ analog feedback pulses with duty cycles of ¼.

The results of FIG. 6A illustrate that instabilities associated with higher-order analog band-pass loop filters can sometimes be avoided by reducing the duty cycles of analog feedback signals to values smaller that the inverse of the sampling frequency. For the exemplary Δ-Σ ADCs simulated, RZ analog feedback pulses with duty cycles of ⅓ or less produce regions of stable operation even though the Δ-Σ ADCs have fourth-order analog band-pass loop filters 20.

In an embodiment of a Δ-Σ ADC, it is also desirable to have a high output SNR. For a Δ-Σ ADC, the output SNR is given by:

$$SNR = 10 \cdot \log\left(\frac{\text{output signal power}}{\text{in-band output noise power}}\right)$$
$$\approx 10 \cdot \log(3) + 20 \cdot N \cdot \log(2) - 10 \cdot \log\left(\frac{H_{in\text{-}band}}{f_s}\right)$$

Here, N is the number of bits of the quantizer, $f_s$ is the sampling frequency, and $H_{in\text{-}band}$ is given by:

$$H_{in\text{-}band} = \int_{bandwidth} |NTF(f)|^2 \, df$$

NTF(f) depends on the frequency and the feedback stream gains $K_1$ and $K_2$. The $K_1$ and $K_2$ dependences cause the SNR to vary with the gain of the active feedback loop 24.

Figure 6B:
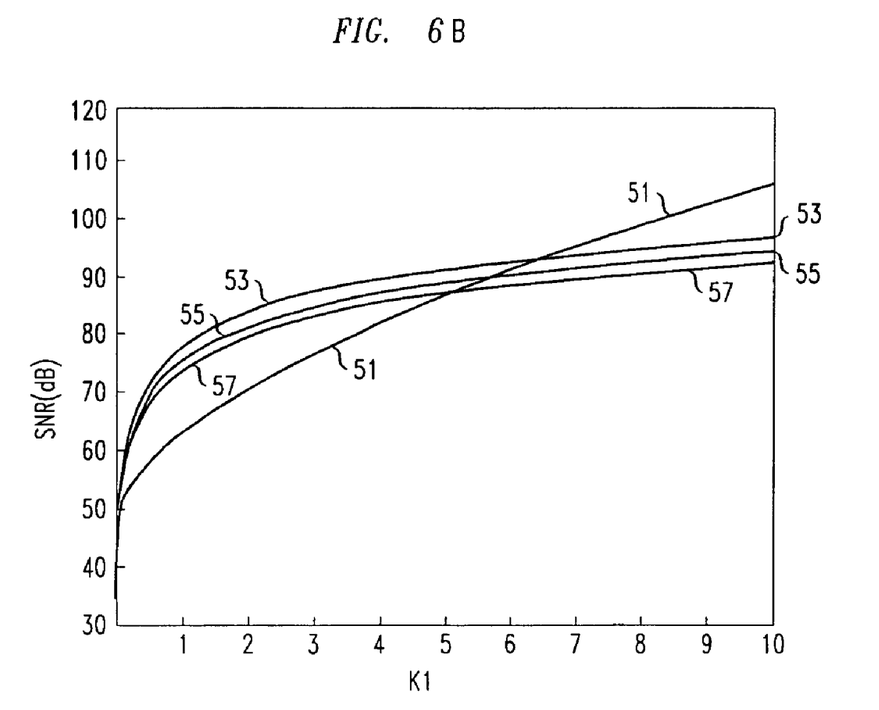

In FIG. 6B, graphs 51, 53, 55, and 57 illustrate how output SNR varies with stream gain $K_1$ for the exemplary Δ-Σ ADCs already described with respect to FIG. 6B. Graphs 51, 53, 55, and 57 show output SNRs for Δ-Σ ADCs in which the DA converter 28 produces analog feedback pulse of the NRZ form, the ½ duty cycle RZ form, the ⅓ duty cycle RZ form, and the ¼ duty cycle RZ form, respectively. Graphs 55 and 57 show that RZ analog feedback pulses with duty cycles of ⅓ and ¼ will produce output SNRs greater than 80 dB for ranges of $K_1$ that do not cause operating instabilities. In preferred embodiments of the Δ-Σ ADCs of FIG. 2, the values of $K_1$ and $K_2$ are selected to both ensure operating stability, i.e., absence of NTF poles with radii larger than one, and high values of the output SNR.

Other embodiments of the invention will be apparent to those of skill in the art in light of the specification, drawings, and claims of this application.

What is claimed is:

1. An apparatus comprising:
   a delta-sigma analog-to-digital converter for converting an analog input signal, comprising:
   an analog band-pass loop filter configured to filter an analog signal derived from the analog input signal, the loop filter having a center band-pass frequency; and
   a quantizer configured to produce a series of digital signals by sampling the filtered analog signal from the loop filter at a sampling frequency, wherein the series of digital signals has a data-carrying frequency spectrum that is a mirror image of a data-carrying frequency spectrum of the analog input signal, the data-carrying spectrum of the series being located between the center band-pass frequency and zero; and
   a digital-to-analog converter configured to generate a series of the analog feedback signals at the sampling frequency such that each analog feedback signal has a duty cycle of less than ½ and corresponds to one of the digital *signals*.

2. The apparatus of claim 1, wherein the sampling frequency is $f_s$, the center band-pass frequency of the loop filter is $f_c$, and $f_s=(4/3)f_c\pm10\%$.

3. The apparatus of claim 1, wherein the loop filter has an order of four or higher.

4. The apparatus of claim 1, further comprising a digital demodulator being coupled to receive the digital signals and configured to remove frequencies above a lower edge of the loop filter's band-pass frequency.

5. The apparatus of claim 1,
   wherein the analog band-pass loop filter is configured to filter the analog signal derived from the analog input signal by sequentially combining the analog feedback signals with the analog input signal.

6. The apparatus of claim 5, wherein the loop filter has an order that is higher than two.

7. The apparatus of claim 1, wherein the digital-to-analog converter is configured to produce the analog feedback signals in a return-to-zero format.

8. The apparatus of claim 1, wherein the digital-to-analog converter is configured to produce the analog feedback signals with duty cycles of less than about ⅓.

9. A method, comprising:
   transmitting an analog input signal having a data-carrying band to a delta-sigma analog-to-digital converter to convert the analog input signal into a series of digital signals having a data-carrying band;
   filtering a modified analog signal with a loop band-pass filter having a center band-pass frequency; and
   wherein the series of digital signals has a data-carrying frequency spectrum that is a mirror image of a data-carrying frequency spectrum of the analog input signal, the data-carrying spectrum of the series being located between the center band-pass frequency and zero;

performing digital-to-analog conversions of the digital signals to sequentially produce analog feedback signals with duty cycles of less than ½; and producing the modified analog signal filter by sequentially combining the analog feedback signals with the analog input signal.

10. The method of claim 9, further comprising;

sampling the filtered modified analog signal to produce the digital signals at a sampling frequency.

11. The method of claim 10, wherein the sampling frequency is $f_s$, a center band-pass frequency of the loop filter is $f_c$, and $f_c=(4/3)f_s \pm 10\%$.

12. The method of claim 10, wherein the loop filter has an order of four or higher.

13. The method of claim 9, further comprising:

filtering the digital signals with a digital demodulator whose band pass is configured to remove frequencies higher than a lower edge of the loop filter's band pass.

14. The method of claim 9, wherein the act of performing produces the analog feedback signals with duty cycles of less than ⅓.

15. The method of claim 9, wherein the act of performing produces the analog feedback signals in a return-to-zero format.

* * * * *